United States Patent
Pai et al.

(10) Patent No.: US 12,210,058 B1
(45) Date of Patent: Jan. 28, 2025

(54) CLOCK GATING FOR POWER REDUCTION DURING TESTING

(71) Applicant: Marvell Asia Pte Ltd, Singapore (SG)

(72) Inventors: Sreekanth G. Pai, Cochin (IN); Harry I. Linzer, Raleigh, NC (US); Harish Mundrathi, Bangalore (IN); Santosh Kumar Surendra, Bangalore (IN)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 18/359,182

(22) Filed: Jul. 26, 2023

Related U.S. Application Data

(60) Provisional application No. 63/393,314, filed on Jul. 29, 2022.

(51) Int. Cl.
*G01R 31/28* (2006.01)
*G01R 31/317* (2006.01)

(52) U.S. Cl.
CPC . *G01R 31/31721* (2013.01); *G01R 31/31727* (2013.01)

(58) Field of Classification Search
None
See application file for complete search history.

(56) References Cited

U.S. PATENT DOCUMENTS

| | | | | |
|---|---|---|---|---|
| 9,170,301 | B1* | 10/2015 | Gallagher | G01R 31/31813 |
| 2014/0152678 | A1* | 6/2014 | Sharma | G06F 3/14 |
| | | | | 345/522 |
| 2015/0143189 | A1* | 5/2015 | Li | G01R 31/318575 |
| | | | | 714/726 |
| 2017/0205464 | A1* | 7/2017 | Oomman | G01R 31/318583 |
| 2018/0067515 | A1* | 3/2018 | Jain | G06F 1/12 |
| 2020/0103464 | A1* | 4/2020 | Fridburg | G01R 31/31716 |
| 2020/0381419 | A1* | 12/2020 | Chang | G01R 31/002 |

* cited by examiner

*Primary Examiner* — Mujtaba M Chaudry

(57) ABSTRACT

A method of testing an integrated circuit device that includes components of first and second types, where the components of the second type consume power when clocked even when not active, includes gating off the clock signal to prevent clock signals from reaching the components of the second type, and applying test inputs to the components of the first type. Gating off the clock signals to the components of the second type may include preventing the clock signals from reaching individual components of the second type, or preventing the clock signals from reaching each clock tree branch that contains only components of the second type, or, when a clock tree serving the components of the second type supplies clock signals only to the components of the second type, preventing the clock signals from reaching the clock tree.

21 Claims, 9 Drawing Sheets

CLOCK GATING FOR POWER REDUCTION DURING TESTING

CROSS REFERENCE TO RELATED APPLICATION

This disclosure claims the benefit of, commonly-assigned U.S. Provisional Patent Application No. 63/393,314, filed Jul. 29, 2022, which is hereby incorporated by reference herein in its entirety.

FIELD OF USE

This disclosure relates to reducing power consumption during testing of integrated circuit devices. More particularly, this disclosure relates to gating off clock signals to portions of an integrated circuit device that are not being tested, to reduce power consumption caused by clock state changes in those untested device portions.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuit devices may be tested after fabrication, both to determine whether the circuit design functions as intended, and to detect any fabrication errors that may have occurred, by applying a known signal stream to the device and observing resulting intermediate and/or output signals. Such testing operations may consume substantial power as various components on the integrated circuit device change state in response to the applied signals. In some testing operations that are performed on only portions of the integrated circuit device, inputs may be applied to other portions of the integrated circuit device, that are not under test, to keep outputs of those other portions in a constant or steady state to reduce power consumption by those portions not under test.

SUMMARY

In accordance with implementations of the subject matter of this disclosure, a method of testing an integrated circuit device that includes components of a first type and components of a second type, where the components of the second type consume power when clocked even when not active, includes gating off clock signals to prevent the clock signals from reaching the components of the second type, and applying test inputs to the components of the first type.

In a first implementation of such a method, gating off the clock signals to the components of the second type may include preventing the clock signals from reaching individual components of the second type.

In a second implementation of such a method, gating off the clock signals to the components of the second type may include preventing the clock signals from reaching each clock tree branch that contains only components of the second type.

In a third implementation of such a method, when a clock tree serving the components of the second type supplies clock signals only to the components of the second type, gating off clock signals to the components of the second type may include preventing the clock signals from reaching the clock tree.

A fourth implementation of such a method may further include preventing the clock signals from reaching any components of a third type.

A first aspect of that fourth implementation may include preventing the clock signals from reaching any memory components.

In accordance with implementations of the subject matter of this disclosure, an integrated circuit device includes components of a first type, components of a second type that consume power when clocked even when not active, and clock gating circuitry configured to, during testing of the components of the first type, gate off clock signals to prevent the clock signals from reaching the components of the second type.

In a first implementation of such an integrated circuit device, the clock gating circuitry may include a respective clock gating element configured to prevent the clock signals from reaching each component of the second type.

In a second implementation of such an integrated circuit device, the clock gating circuitry may include a single clock gating element configured to prevent propagation of the clock signals out of a clock source of the components of the second type.

In a third implementation of such an integrated circuit device, the clock gating circuitry may include a plurality of clock gating elements, each clock gating element in the plurality of clock gating elements being configured to prevent the clock signals from reaching respective branches of a clock tree, each respective branch including only the components of the second type.

In a fourth implementation of such an integrated circuit device, the clock gating circuitry may include at least one integrated clock gate cell configured to prevent the clock signals from reaching the components of the second type.

In a fifth implementation of such an integrated circuit device, the clock gating circuitry may include at least one CLOCK-AND (CKAN) cell configured to prevent the clock signals from reaching the components of the second type.

In a sixth implementation of such an integrated circuit device, the components of the first type may include flip-flops in external-facing circuitry of the integrated circuit device, and the components of the second type may include flip-flops in internal-facing circuitry of the integrated circuit device.

According to a first aspect of that sixth implementation, the components of the second type may further include all memory devices in the integrated circuit device.

In accordance with implementations of the subject matter of this disclosure, a method of configuring an integrated circuit device for testing, where the integrated circuit device has components of a first type, and has components of a second type that consume power when clocked even when not active, includes configuring clock gating circuitry to, during testing of the components of the first type, gate off clock signals to prevent the clock signals from reaching the components of the second type.

In a first implementation of such a method, configuring the clock gating circuitry to prevent the clock signals from reaching the components of the second type may include providing a respective clock gating element configured to prevent the clock signals from reaching each respective component of the second type.

In a second implementation of such a method, configuring the clock gating circuitry to prevent the clock signals from reaching the components of the second type may include configuring a single clock gating element to prevent propagation of the clock signals out of a clock source of the components of the second type.

In a third implementation of such a method, configuring the clock gating circuitry to prevent the clock signals from reaching the components of the second type may include providing a plurality of clock gating elements, and configuring individual ones of clock gating elements among the plurality of clock gating elements to prevent propagation of the clock signals to a respective branch of a clock tree, each respective branch including only the components of the second type.

According to a first aspect of that third implementation, configuring each clock gating element in the plurality of clock gating elements to prevent propagation of the clock signals to the respective branch of the clock tree may include providing a first clock gating element at one of the components of the second type, moving the first clock gating element away from the one of the components of the second type toward a source of the clock signals until a first node in the clock tree is reached, examining at the first node in the clock tree whether the first node feeds any components of the first type, when the first node feeds any components of the first type, returning the first clock gating element to the one of the components of the second type, and when the first node does not feed any components of the first type, repeating the providing, the moving and the examining with additional nodes closer to the source of the clock signals until (a) reaching a further node that feeds at least one component of the first type, or (b) reaching the source of the clock signals, and then moving the first clock gating element one node further from the source of the clock signals.

A first instance of that first aspect may further include, when any one of the first node or any further node is a selector configured to allow selection among a plurality of clock signals, positioning the first clock gating element at an output of the selector.

A second instance of that first aspect may further include, before the moving, advancing the first clock gating element to the source of the clock signal, examining whether the first clock gating element at the source of the clock signal feeds any components of the first type, when the first clock gating element at the source of the clock signal does not feed any components of the first type, maintaining the first clock gating element at the source of the clock signal, and when the first clock gating element at the source of the clock signal feeds at least one component of the first type, returning the first clock gating element to the one of the components of the second type and executing the moving.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
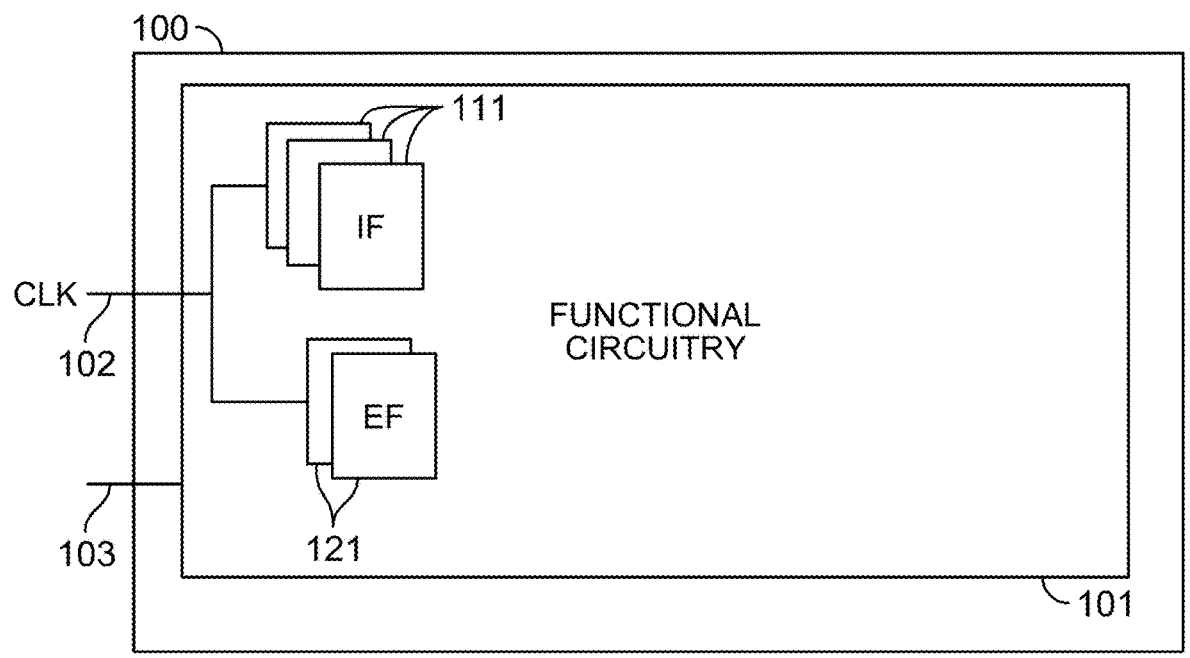
FIG. 1 is a schematic representation of an integrated circuit device with which implementations of the subject matter of this disclosure may be used.

As noted above, integrated circuit devices may be tested after fabrication, both to determine whether the circuit design functions as intended, and to detect any fabrication errors that may have occurred, by applying a known signal stream to the device and observing resulting intermediate and/or output signals. Such testing operations may consume substantial power as various components on the integrated circuit device change state in response to the applied signals.

In some testing operations that are performed on only portions of the integrated circuit device, inputs may be applied to other portions of the integrated circuit device, that are not under test, to keep outputs of those other integrated circuit device portions in a constant or steady state to reduce power consumption by those integrated circuit device portions not under test. However, clock signals that are applied to the device as a whole will be applied to those other integrated circuit device portions that are not under test, and toggling clock signals may result in some power consumption by the integrated circuit device portions not under test even if the outputs of those integrated circuit device portions not under test are held in, or driven to, constant states. For example, if a circuit contains flip-flops, then even if the data output of a flip-flop is held in, or is driven to, a constant state, if the clock input of the flip-flop continues to toggle, the power reduction achieved by holding the output in, or driving the output to, a constant state may be only between 50% and 70%, meaning that the flip-flop continues to consume between 30% and 50% of the power that would be consumed in normal operation.

In some integrated circuit devices there are some circuitry areas each of which transfers signals purely within itself, which may be referred to as "internally-facing circuitry areas," and other circuitry areas each of which transfers signals outside itself (to other circuitry areas on the device or to external terminals of the device), which may be referred to as "externally-facing circuitry areas." These different types of circuitry areas may be tested separately.

That is, there may be one test mode in which only the purely internal circuitry areas are tested, and another test mode in which only the circuitry areas that communicate externally are tested. When testing one type of circuitry area, typically logic in the other type of circuitry area may be held in, or driven to, a constant state to conserve power.

However, logic in the type of circuitry area not being tested typically continues to be clocked during the testing, consuming, as noted above, between about 30% and about 50% of the power that such logic would consume in normal operation. The number of logic elements (e.g., registers or flip-flops) in the internal circuitry areas typically greatly exceeds the number of logic elements in the externally-facing circuitry areas. Therefore, clocking of logic elements in the externally-facing circuitry areas during testing of circuitry in the internally-facing circuitry areas may not add significantly to the overall power consumption. But clocking of logic elements in the internally-facing circuitry areas during testing of circuitry in the externally-facing circuitry areas does add significantly to the overall power consumption. In fact, if large numbers of components need to be clocked, the power requirements may exceed the ability of test equipment to supply power, unless a more robust tester were used. Even then, the power grid of the integrated circuit device itself also would have to be made more robust just to support the testing.

Therefore, in accordance with implementations of the subject matter of this disclosure, power consumption during testing of different portions of integrated circuit devices can be reduced by gating off—i.e., selectively blocking propagation of—clock signals to portions of the device that are not being tested. Thus, in the foregoing example of an integrated circuit device with internal circuitry areas with large numbers of flip-flops, and externally-facing circuitry areas with relatively small numbers of flip-flops, clock signals to the internal circuitry areas—and particularly to the flip-flops in the internal circuitry areas—may be gated off during testing of the externally-facing circuitry areas. However, that is only one example, and implementations of the subject matter of this disclosure may apply to any type of integrated device having two different types of circuitry that are tested separately, particularly if one of the different types of circuitry includes components—such as, but not limited to, flip-flops or registers—that consume power when clocked even if those components are otherwise in a constant or steady state.

Integrated circuit devices according to implementations of the subject matter of this disclosure may be designed to accommodate gating off of clock signals to different components, so that certain components can be tested while clock signals to other components are gated off. At one extreme, each type of circuitry that might be tested separately can have its own clock tree (so that in the example above, there may be one clock tree for all internal-facing circuitry and another clock tree for all external-facing circuitry). However, such an implementation, providing two or more clock trees on the integrated circuit device, while within the scope of this disclosure, may be impractical from a routing perspective, or simply from the perspective of the amount of device area that would be consumed by clock trees, and also because of potential variation between the clock trees which could require additional design margin.

At another extreme, there may be a separate gating element for each component (e.g., each register or flip-flop) whose clock should be gated off when the component is not being tested. However, such an implementation, while within the scope of this disclosure, may be impractical from the perspective of the amount of device area that would be consumed by the individual gating elements.

In less extreme implementations of the subject matter of this disclosure, clock gating elements may be placed at nodes in a clock tree, downstream of which nodes there are only components of the type to be gated off during testing. In an implementation of a corresponding method for designing or fabricating such integrated circuit devices, locations for the clock gating elements may be determined by starting at a single component known to be of the type to be gated off. From there, the conductor providing the clock signal for that component is traced all the way back the clock source (e.g., a clock pin of the integrated circuit device, or, alternatively, output of an on-board clock generator such as a phase-locked loop). From the source location, one looks forward (e.g., using a database of locations of the two types of components), and if only components of the type to be gated off are found, the clock gating element may be placed at the source. But if, looking forward, one finds a mix of (a) components of the type to be gated off and (b) components of the type to be tested and therefore not gated off (even if there is only one of that type of component), then one returns to the original component of the type to be gated off and works toward the clock source node by node.

At each node, all branches going forward from that node are examined. If none of the branches includes components of the type to be tested, then one moves back, to the next node closer to the clock source, and repeats the examination on all branches for components of the type to be tested. If still no components of the type to be tested are found, one moves back again, and so on. But as soon as at least one component of the type to be tested is found on any branch from a node being examined, then one returns to the previous node, away from the clock source, and inserts a clock gating element there. In addition, if, as one moves toward the clock source, one encounters a selector circuit, such as a multiplexer, that can select from two or more different clock sources, then a clock gating element would be placed downstream of the selector circuit, because there is no way to know with certainty in advance which of the two or more clocks might be selected during any particular test operation.

In the method just described, the initial examination forward from the clock source could be omitted, as one would eventually reach that location by moving backwards through the nodes, assuming that there are no components of the type to be tested in that clock tree. But in view of the amount of time it would take to explore all nodes, which could number in the thousands, it may be worthwhile taking the small additional amount of time necessary for an examination forward from the clock source, on the chance that the entire clock tree may be found to contain only components of the type to be gated off.

In some implementations, the clock gating element may be an integrated clock gate (ICG) cell. However, ICG cells may themselves be relatively large and consume a not-insubstantial amount of power. Therefore, in other implementations, the clock gating element may be a CLOCK-AND cell (sometimes referred to as a CKAN cell), which includes as few as four transistors. Logically, a CLOCK-AND cell operates similarly to a standard AND-gate. However, the path from one of the inputs to the output (the path used for the clock signal while the other path is used for an enable signal) is optimized to minimize distortion of the clock signal. In particular, the path used for the clock signal may be optimized to minimize delay between its clock input and the gate output, and also to minimize the difference in delay between propagation of rising edges of the input and propagation of falling edges of the input. While an ordinary AND-gate theoretically could be used for this purpose, use of an ordinary AND-gate may result in greater distortion of the clock waveform because, e.g., if the difference in delay between propagation of rising edges of the input and propagation of falling edges of the input is not balanced, the relative widths of the "high" and "low" portions of the clock waveform may be changed as a result passing through the gate.

The subject matter of this disclosure may be better understood by reference to FIGS. 1-12.

As seen in FIG. 1, an integrated circuit device 100 may have functional circuitry 101 that includes internal-facing (IF) circuitry 111 and external-facing (EF) circuitry 121, which are clocked by clock signal (CLK) 102. Functional signals 103 applied to functional circuitry 101 are routed to various ones of internal-facing circuitry 111 and external-facing circuitry 121 according to the particular logical and functional design of functional circuitry 101.

Although the internal-facing circuitry 111 and external-facing circuitry 121 are shown as separate blocks, there may be blocks of circuitry that include internal-facing circuitry 111, surrounded by external-facing circuitry 121 that communicates with other blocks that have other internal-facing circuitry 111 surrounded by other external-facing circuitry 121. The external-facing circuitry 121 of some blocks also may communicate externally of integrated circuit device 100.

It is noted that if external-facing circuitry 121 constitutes the boundary area of a circuitry block that also includes internal-facing circuitry 111, then the amount of internal-facing circuitry 111 in such a circuitry block is likely to exceed, by area, the amount of external-facing circuitry 121 in the circuitry block. Therefore, as noted above, if, during testing, all circuitry in the circuitry block is clocked, then even if functional signals 103 are configured as test signals for external-facing circuitry 101 while driving the internal-facing circuitry 111 to a constant value or state, components, such as flip-flops, of the internal-facing circuitry 111, which may exceed the amount of external-facing circuitry 121 being tested, may continue to consume substantial power as a result of the continual clocking of clock signals 102.

Figure 2:
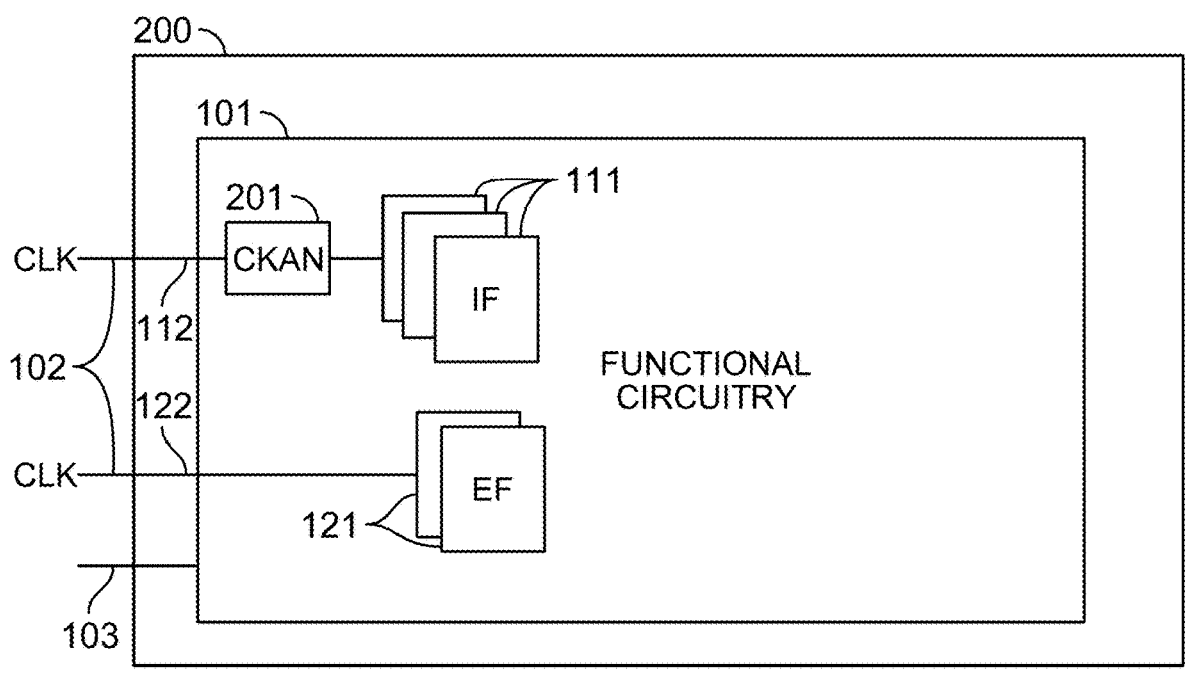
FIG. 2 is a schematic representation of an integrated circuit device similar to that of FIG. 1 but having separate clock trees for different types of circuit components, in accordance with implementations of the subject matter of this disclosure.

In one implementation 200 of the subject matter of this disclosure for reducing that power consumption during testing of external-facing circuitry 121, separate clock trees 112, 122 are configured for providing clock signals 102 to internal-facing circuitry 111 and external-facing circuitry 121, respectively, as shown in FIG. 2. A clock-gating element 201 may be provided to gate off clock tree 112 from internal-facing circuitry 111 during testing of external-facing circuitry 121, while allowing clock signals 102 to propagate via clock tree 112 to internal-facing circuitry 111 during normal operation, and during testing, if any, of internal-facing circuitry 111. However, as noted above, internal-facing circuitry 111 and external-facing circuitry 121 may be intermingled in circuitry blocks of functional circuitry 101, and therefore providing separate clock trees for internal-facing circuitry 111 and external-facing circuitry 121 may not be practical in some implementations.

Figure 3:
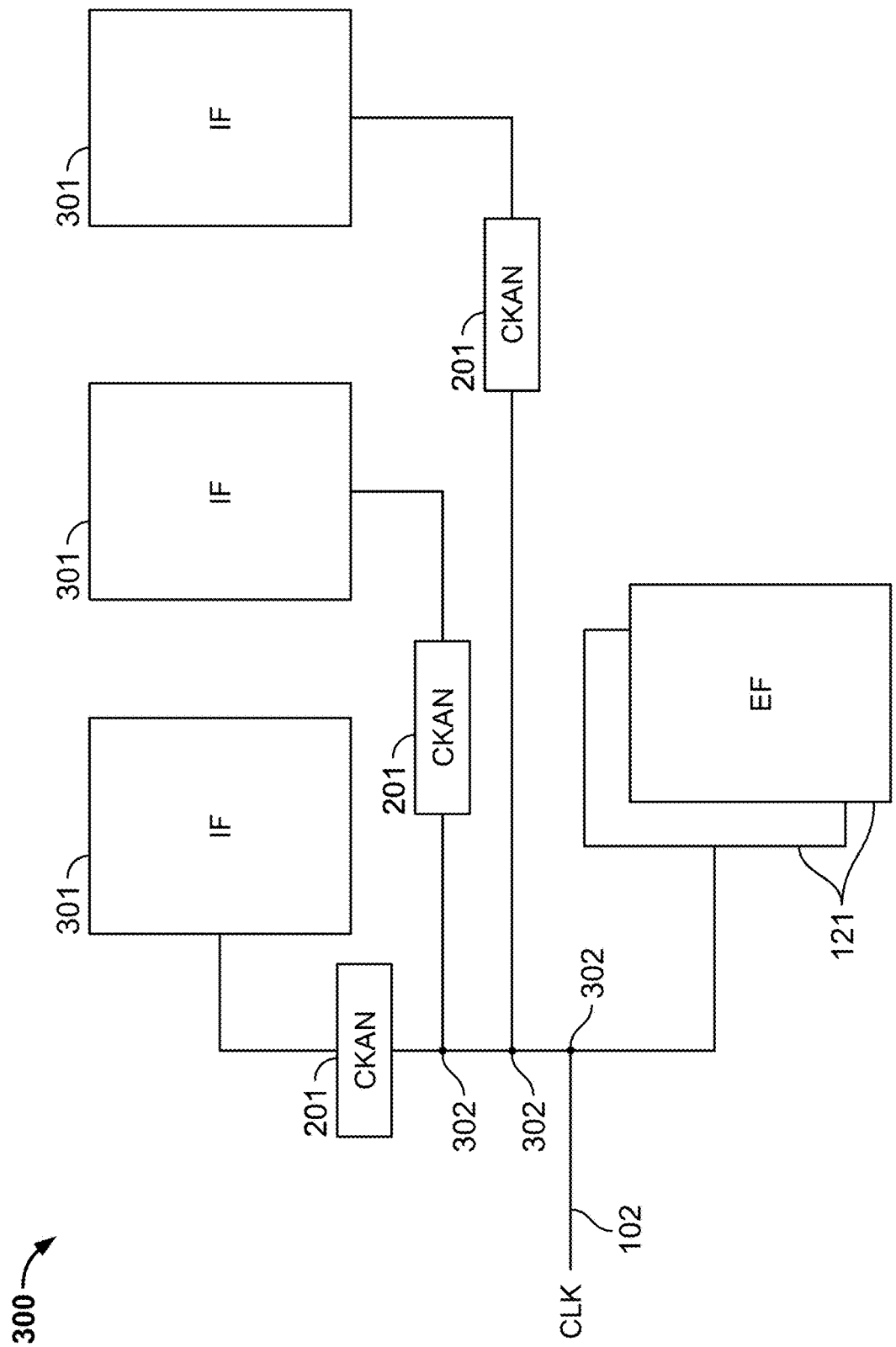
FIG. 3 shows a first implementation of a clock gating arrangement in accordance with the subject matter of this disclosure.

In another implementation 300 shown in FIG. 3, a separate clock-gating element 201 may be provided for each block or element of internal-facing circuitry 301. Such an implementation is straightforward, and does not require a complicated design process to decide where clock-gating elements 201 are required. However, while only three blocks or elements 301 of internal-facing circuitry 111 are shown in FIG. 3, FIG. 3 is illustrative only, and in practice the number of blocks or elements 301 of internal-facing circuitry 111 in an integrated circuit device 100 may be in the hundreds or thousands, which may make implementation 300 impractical because of the device area, and the power, that would be required for so many clock-gating elements 201.

Figure 4:
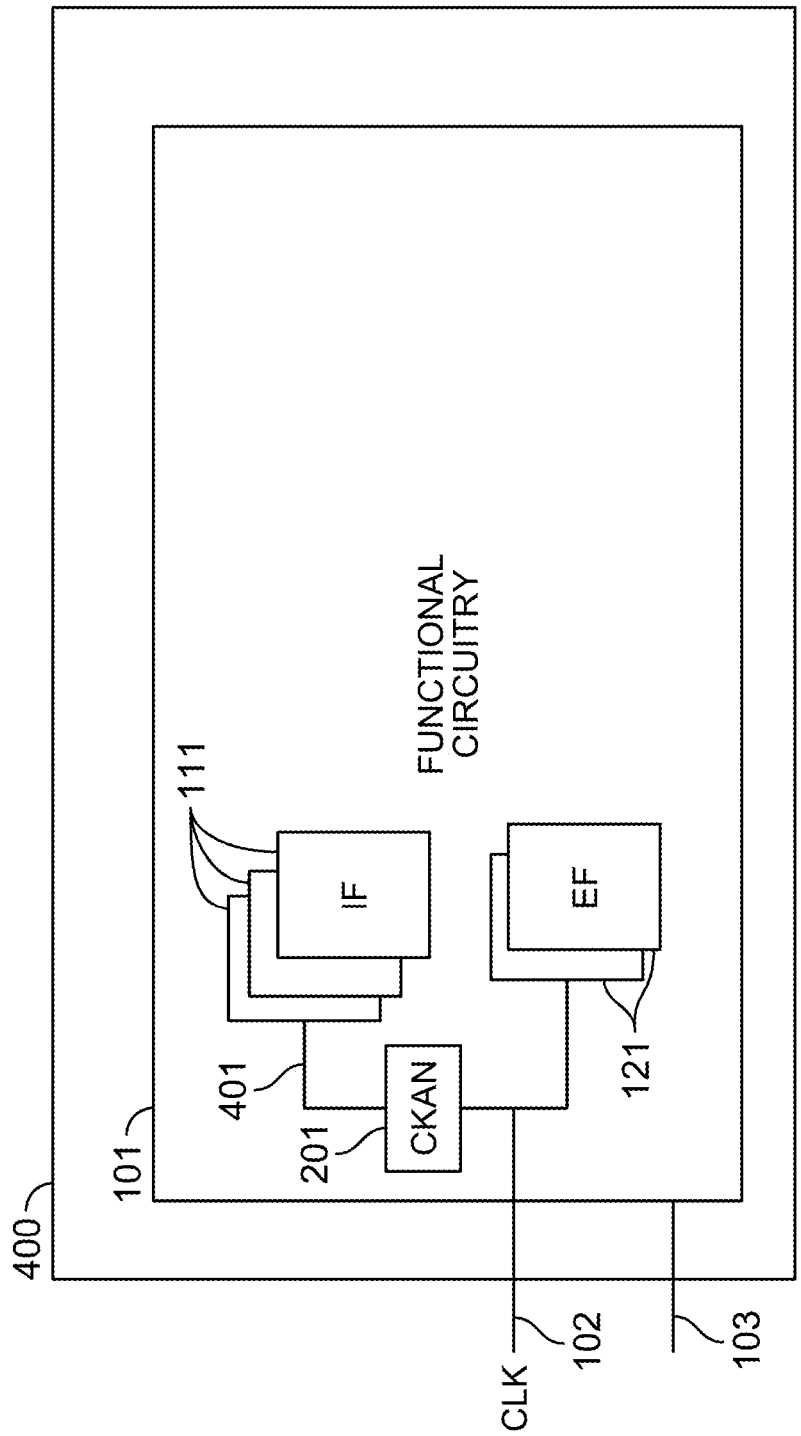
FIG. 4 shows a second implementation of a clock gating arrangement in accordance with the subject matter of this disclosure.

Therefore, implementations such as implementation 400 of FIG. 4 may be provided, in which each clock-gating element 201 gates clock signals for entire branches 401 of the clock tree servicing multiple blocks of internal-facing circuitry 111 (only one such branch is shown in FIG. 4). To determine, during the design of integrated circuit device 100 where to place clock-gating elements 201 to minimize the number of clock-gating elements 201, a list of clock tree nodes may be examined to locate each node 302 that sinks to both internal-facing circuitry 111 and external-facing circuitry 121. A clock-gating element 201 may be placed at, or just upstream of, the next node on any branch from node 302 that does not sink to an external-facing element.

Figure 5:
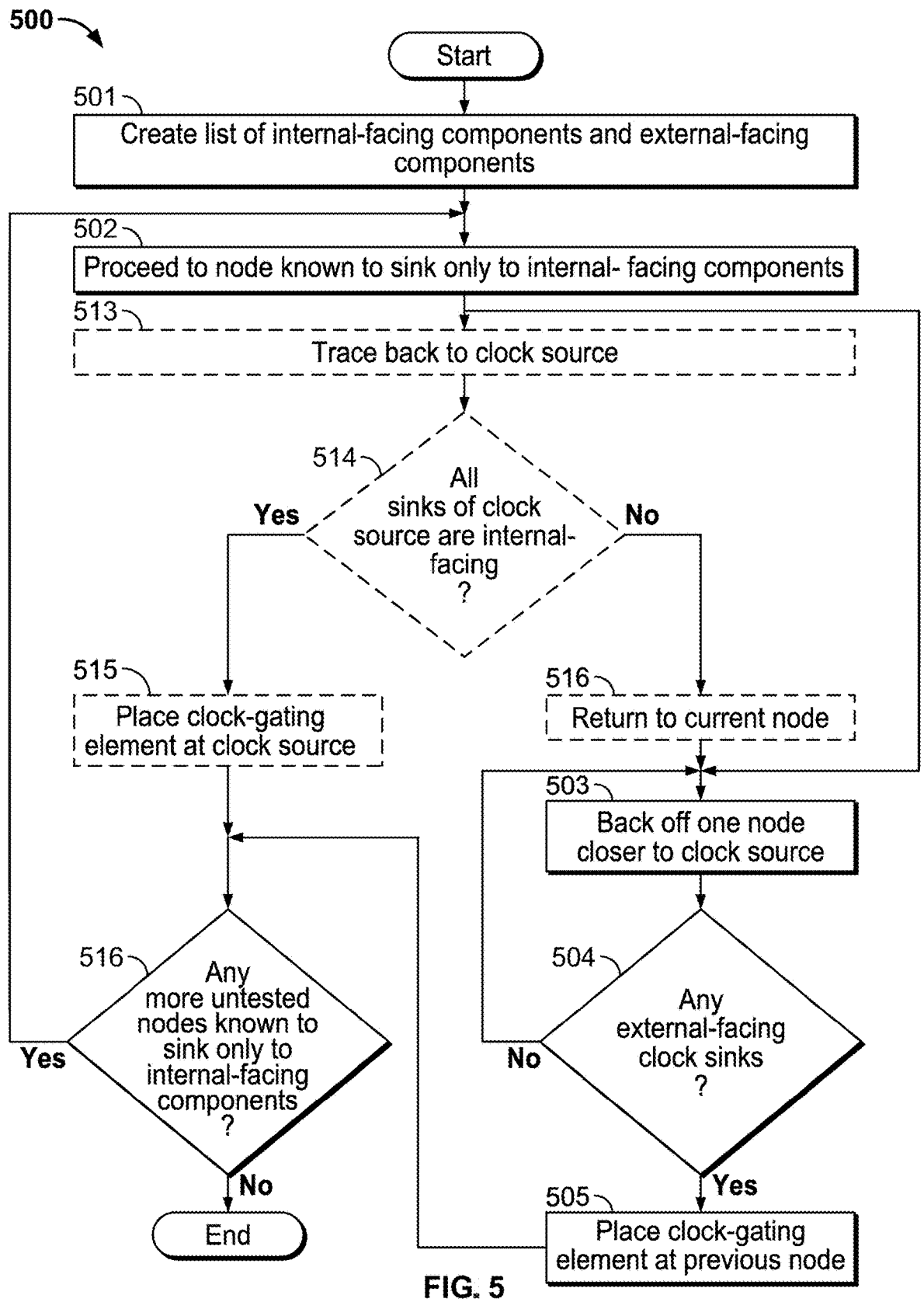
FIG. 5 is a flow diagram of a method according to implementations of the subject matter of this disclosure for placing clock gating elements.

A method 500 for performing such a placement operation is diagrammed in FIG. 5. At 501, in advance, a list of internal-facing components and external-facing components in the integrated circuit device is established. At 502, one begins at a node known to sink only to internal-facing components. This node may be at an individual flip-flop.

Optionally, as described above, one can trace from the current node being examined all the way back to its clock source, to save time in case the clock does not sink to any external-facing component. Thus, at 513, the system may trace back to the clock source, and at 514, it may be determined whether all sinks of the clock source are internal-facing. If so, at 515, a clock-gating element may be placed at the clock source. If, at 514, it is determined that not all sinks of the clock source are internal-facing, then at 516 flow returns to the current node.

Next, or if the option to trace back to the clock source was not taken, at 503 the system backs from the current node one node closer to the clock source. At 504, it determined whether, from that one closer node, the clock sinks to any external-facing components. If not, flow returns to 503 and the system backs up one further node. If at 504 it is determined that the clock does sink to external-facing components from the closer node, then at 505 a clock-gating element is placed at the previous node (further from the clock source).

Whether a clock-gating element is placed at 505 or at 515, then at 506 it is determined whether there are any additional nodes that sink only to internal-facing components that have not been processed. If so, flow returns to 502 to process the next node; otherwise, method 500 ends.

Figure 6:
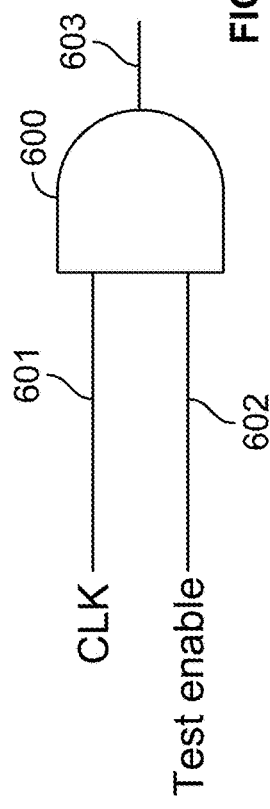
FIG. 6 is a representation of a clock gating element that may be used in implementations of the subject matter of this disclosure.

As noted above, and regardless of whether method 500 or some other method is used to place the clock-gating elements, in some implementations, the clock gating element may be an ICG cell. However, ICGs may themselves be relatively large and consume a not-insubstantial amount of power. Moreover, ICGs may already be present in integrated circuit device 100 for other purposes where clock gating of functional logic is needed (e.g., for elements whose states are changed infrequently, such as, without limitation, configuration registers). In other implementations, the clock gating element may be a CLOCK-AND cell, which includes as few as four transistors, and operates similarly to a standard AND-gate. As shown in FIG. 6, CLOCK-AND cell 600 resembles an ordinary AND-gate and has a clock input 601 and an enable input 602. By asserting a '0' on enable input 602, CLOCK-AND cell 600 can be blocked from passing clock input 601. The path from clock input 601 to the output 603 is optimized to minimize distortion of the clock signal, as compared to an ordinary AND gate.

Figure 7:
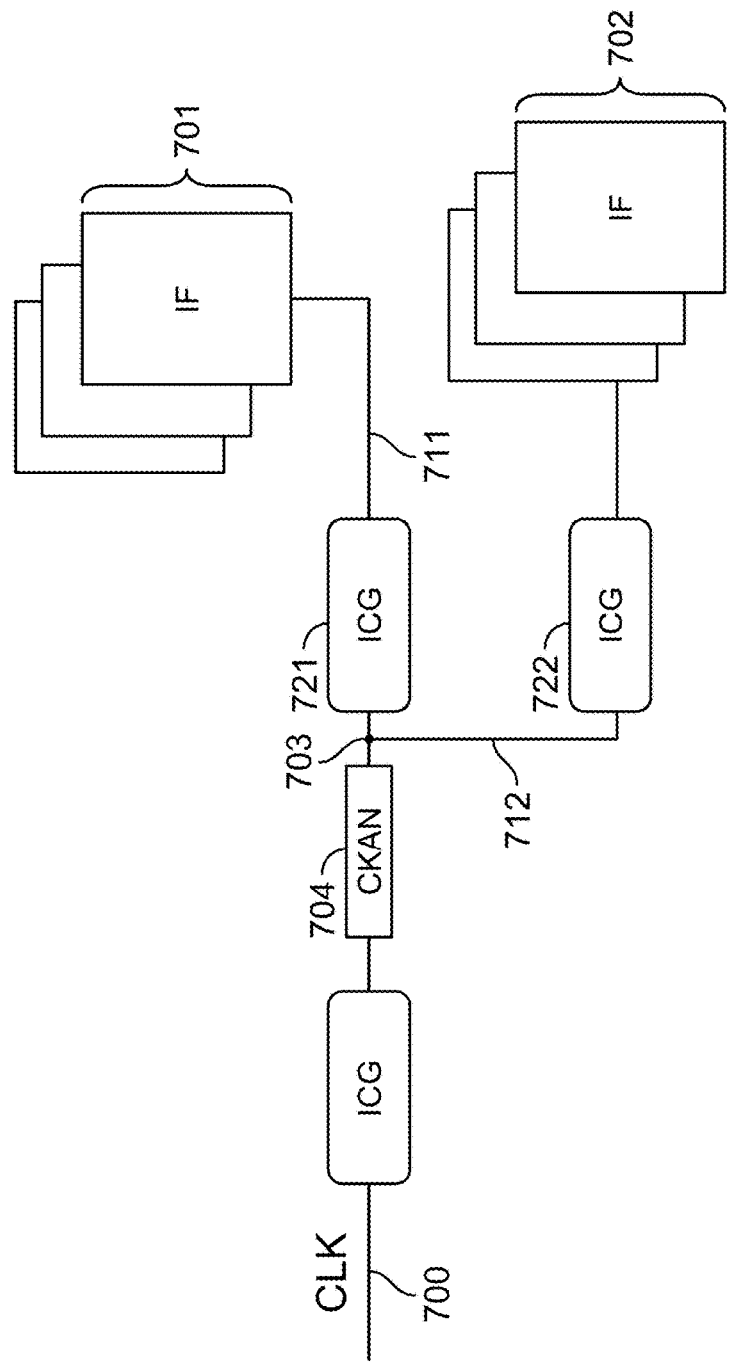
FIG. 7 shows a third implementation of clock gating in accordance with the subject matter of this disclosure.

In implementations in which ICGs are present in integrated circuit device 100 for other purposes, and CLOCK-AND cells 600 are used for clock gating, if at 504 an ICG is found at the current node, then regardless of whether any external-facing clock sinks are found, a CLOCK-AND cell is placed at the previous node. One example of such a situation is seen in FIG. 7, in which each of two groups 701, 702 of internal-facing components occupies its own respective branch 711, 712 of the clock tree of CLK signal 700. Each branch 711, 712 also includes an ICG cell 721, 722. Starting at either node 701 or 702 and tracing back one node to node 703 would find that from node 703, there are no external facing clock sinks. Therefore, CLOCK-AND cell 704 is inserted at that point.

Figure 8:
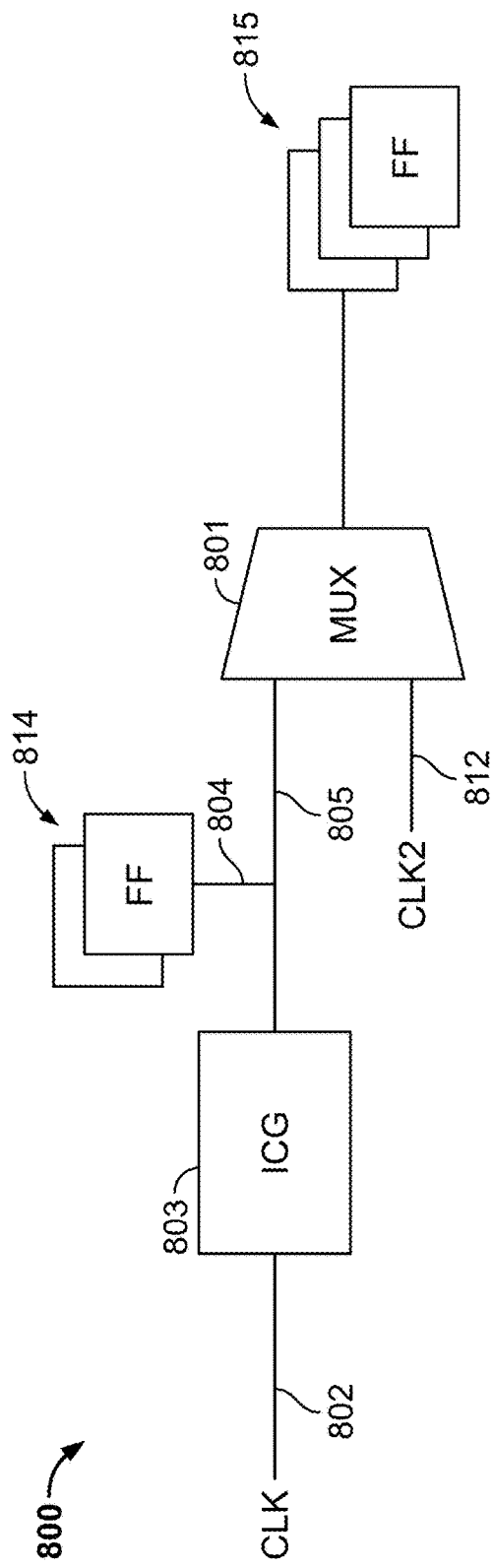
FIG. 8 shows a portion of a circuit that may be gated in accordance with implementations of the subject matter of this disclosure.

FIG. 8 shows an example arrangement of components to illustrate additional implementations of the subject matter of this disclosure. As noted above, if as one moves toward the clock source, one encounters a selector circuit, such as a multiplexer, that can select from two or more different clock sources, then a clock gating element would be placed downstream of the selector circuit (i.e., at its output), because there is no way to know with certainty in advance which of the two or more clocks might be selected during any particular test operation. The arrangement 800 of components in FIG. 8 includes a multiplexer 801 to illustrate that situation. Clock source (CLK) 802 feeds an ICG 803 from which one branch 804 leads to a first group of internal-facing components 814 and a second branch 805 leads to a second group of internal-facing components 815. Multiplexer 801 is located on branch 805 upstream of internal-facing components 815, and couples not only to clock source 802 but to a second clock source (CLK2) 812, allowing selection between the two clock sources 802, 812 for use by internal-facing components 815.

Figure 9:
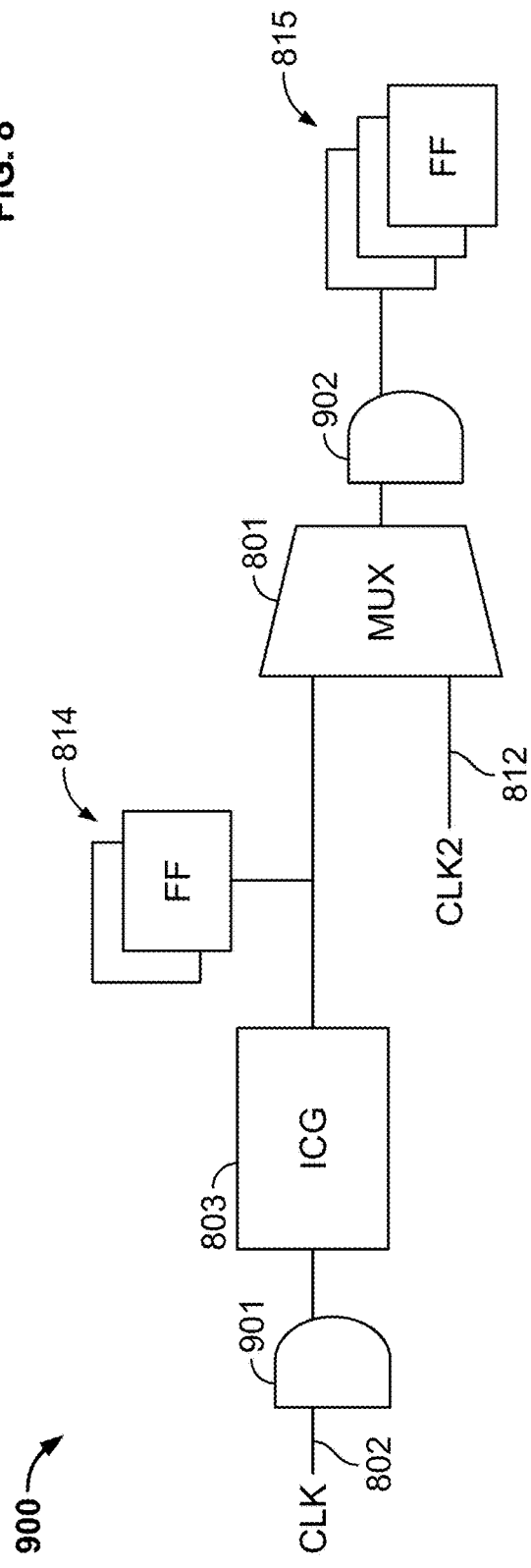
FIG. 9 shows a first implementation of clock gating of the circuit portion of FIG. 8.

FIG. 9 shows one implementation 900 for gating off clock 802 in arrangement 800. A CLOCK-AND cell 901 is inserted upstream of ICG 803. However, even though CLOCK-AND cell 901, if activated, would gate off clock 802 from all components in arrangement 800, the presence of multiplexer 801 means that clock 812 could still be propagated to internal-facing components 815 even if clock 802 were gated off. Therefore, an additional CLOCK-AND cell 902 is inserted downstream of multiplexer 801.

Figure 10:
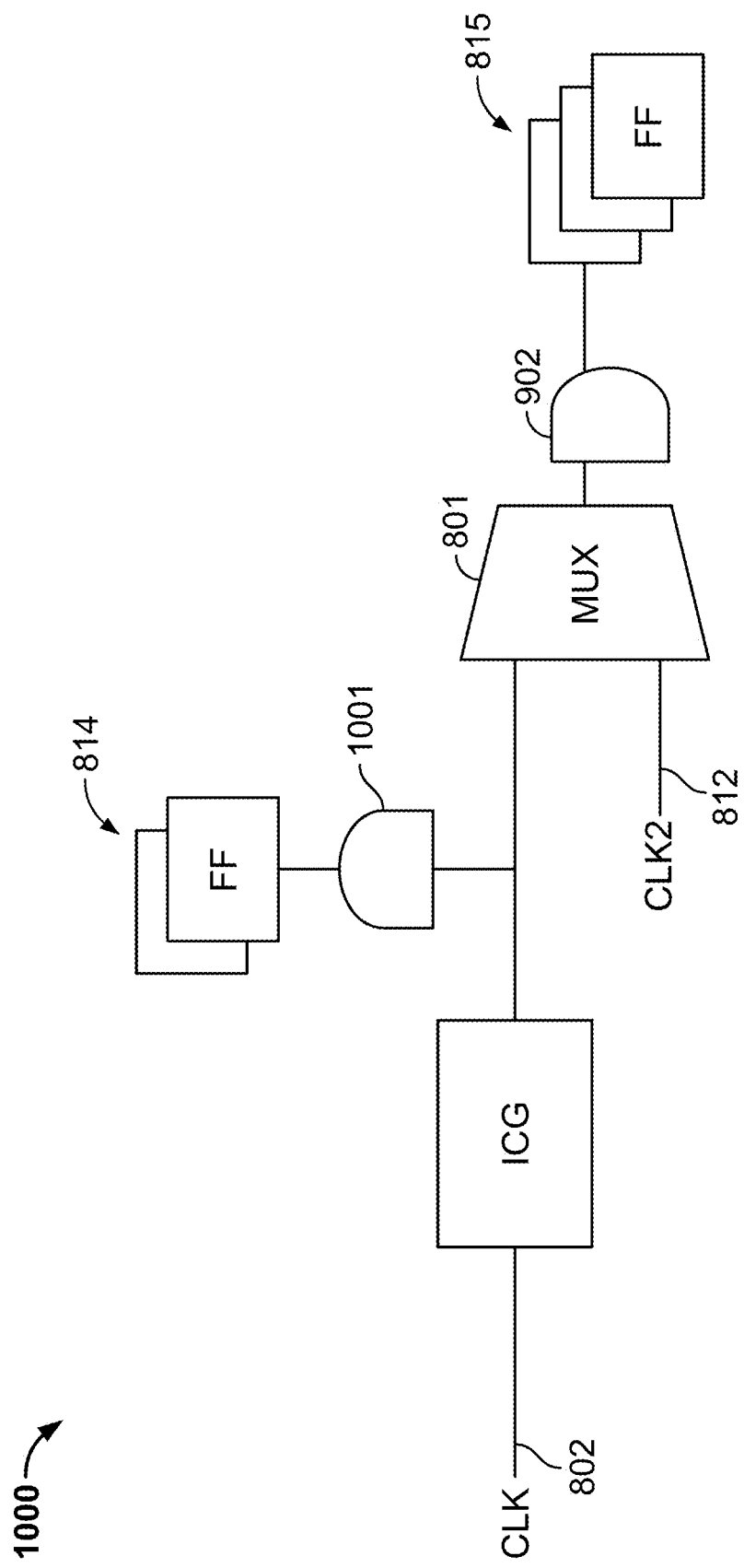
FIG. 10 shows a first implementation of clock gating of the circuit portion of FIG. 8.

FIG. 10 shows another implementation 1000 for gating off clock 802 in arrangement 800. Given that CLOCK-AND cell 902 is required downstream of multiplexer 801 even if clock 802 is gated off, CLOCK-AND cell 901 can be moved to location 1001 with each group of internal-facing components 814, 815 gated off by separate respective CLOCK-AND cells 901, 1001.

Figure 11:
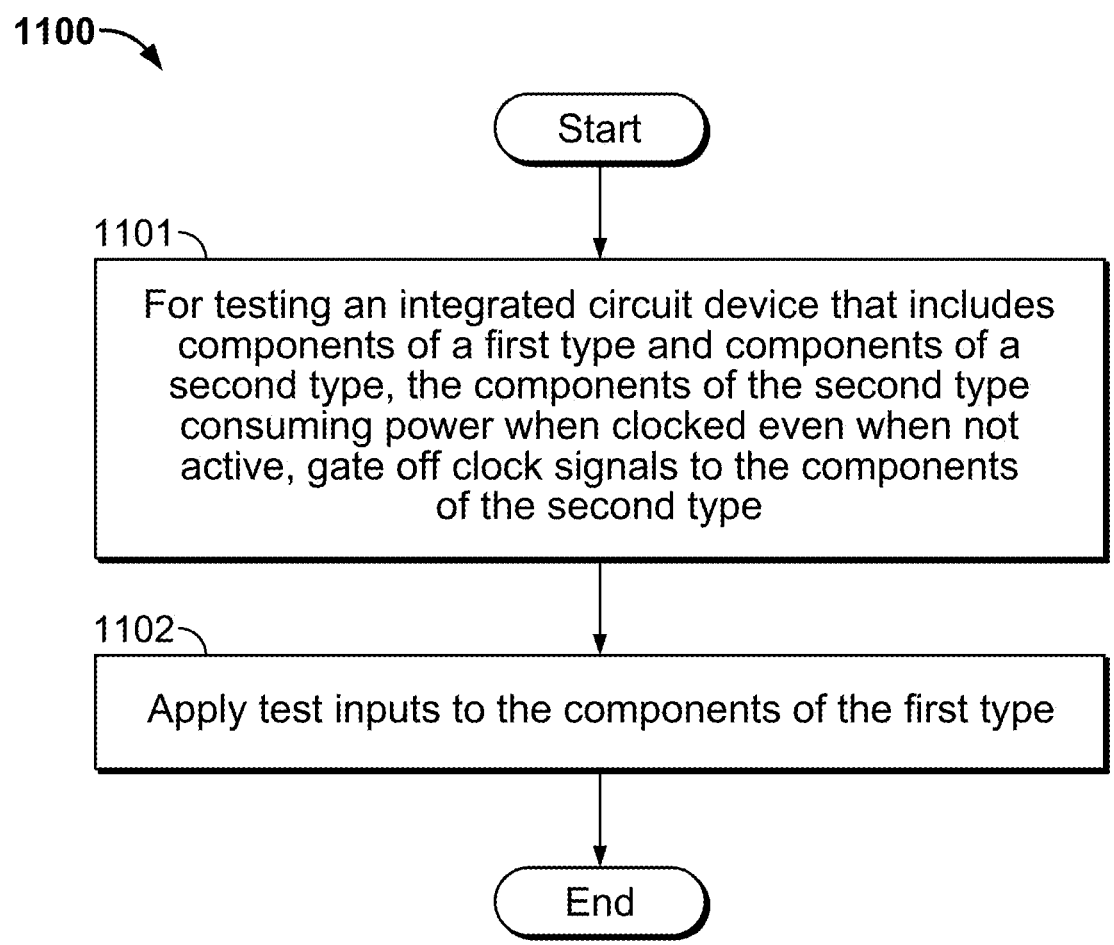
FIG. 11 is a flow diagram illustrating implementations of a first general method in accordance with the subject matter of this disclosure.

A first general method 1100 in accordance with the subject matter of this disclosure, for testing an integrated circuit device that includes components of a first type and components of a second type, the components of the second type consuming power when clocked even when not active, is diagrammed in FIG. 11. Method 1100 begins at 1101, where clock signals to the components of the second type are gated off. At 1102, test inputs are applied to the components of the first type. Method 1100 then ends.

Figure 12:
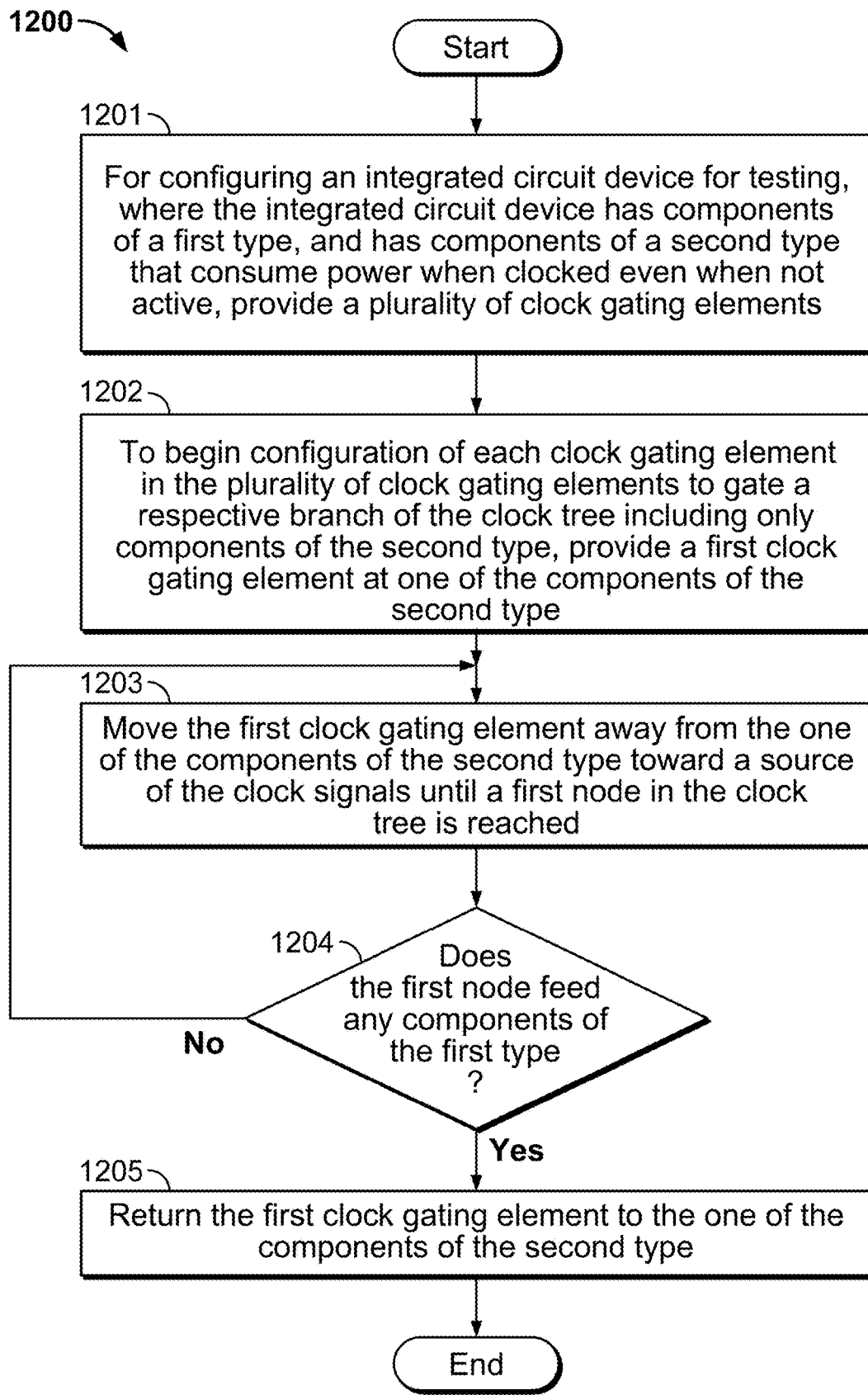
FIG. 12 is a flow diagram illustrating implementations of a second general method in accordance with the subject matter of this disclosure.

A second general method 1200 in accordance with the subject matter of this disclosure, for configuring an integrated circuit device for testing, where the integrated circuit device has components of a first type, and has components of a second type that consume power when clocked even when not active, is diagrammed in FIG. 12. Method 1200 begins at 1201, where a plurality of clock gating elements are provided. At 1202, to begin configuration of each clock gating element in the plurality of clock gating elements to gate a respective branch of the clock tree including only components of the second type, a first clock gating element is provided at one of the components of the second type. At 1203, the first clock gating element is moved away from the one of the components of the second type toward a source of the clock signals until a first node in the clock tree is reached. At 1204, it is determined at the first node in the clock tree whether the first node feeds any components of the first type.

At 1205, when the first node feeds any components of the first type, the first clock gating element is returned to the one of the components of the second type. When the first node does not feed any components of the first type, flow returns to 1203 to repeat the moving and the examining with additional nodes closer to the source of the clock signals until (a) reaching a further node that feeds at least one component of the first type, or (b) reaching the source of the clock signals, and then moving the first clock gating element one node further from the source of the clock signals. Method 1200 then ends.

Thus it is seen that a method and apparatus for gating off clock signals to portions of an integrated circuit device that are not being tested, to reduce power consumption caused by clock state changes in those untested device portions, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of testing an integrated circuit device that includes externally-facing components of a first type which transfers signals outside itself, and internally-facing components of a second type which transfers signals purely within itself, the components of the second type consuming power when clocked even when not active, the method comprising:
    gating off clock signals to prevent the clock signals from reaching the internally-facing components of the second type; and
    applying test inputs to the externally-facing components of the first type.

2. The method of claim 1 wherein gating off the clock signals to the internally-facing components of the second type comprises preventing the clock signals from reaching individual internally-facing components of the second type.

3. The method of claim 1 wherein gating off the clock signals to the internally-facing components of the second type comprises preventing the clock signals from reaching each clock tree branch that contains only internally-facing components of the second type.

4. The method of claim 1 wherein, when a clock tree serving the internally-facing components of the second type supplies clock signals only to the internally-facing components of the second type, gating off clock signals to the internally-facing components of the second type comprises preventing the clock signals from reaching the clock tree.

5. The method of claim 1 further comprising preventing the clock signals from reaching any components of a third type.

6. The method of claim 5 comprising preventing the clock signals from reaching any memory components.

7. An integrated circuit device comprising:
components of a first type;
components of a second type that consume power when clocked even when not active; and
clock gating circuitry configured to, during testing of the components of the first type, gate off clock signals to prevent the clock signals from reaching the components of the second type, the clock gating circuitry comprising at least one clock gating element configured to prevent the clock signals from reaching a component of the second type, each of the at least one clock gating element comprising at most four transistors.

8. The integrated circuit device of claim 7 wherein the at least one clock gating element comprises a respective clock gating element configured to prevent the clock signals from reaching each component of the second type.

9. The integrated circuit device of claim 7 wherein the at least one clock gating element comprises a single clock gating element configured to prevent propagation of the clock signals out of a clock source serving the components of the second type.

10. The integrated circuit device of claim 7 wherein the at least one clock gating element comprises a plurality of clock gating elements, each clock gating element in the plurality of clock gating elements being configured to prevent the clock signals from reaching respective branches of a clock tree, each respective branch including only the components of the second type.

11. The integrated circuit device of claim 7 wherein the at least one clock gating element comprises at least one CLOCK-AND (CKAN) cell configured to prevent the clock signals from reaching the components of the second type.

12. The integrated circuit device of claim 11 wherein each of the at least one clock gating element comprises a respective CLOCK-AND (CKAN) cell configured to prevent the clock signals from reaching the components of the second type.

13. The integrated circuit device of claim 7 wherein:
the components of the first type comprise flip-flops in externally-facing circuitry of the integrated circuit device; and
the components of the second type comprise flip-flops in internally-facing circuitry of the integrated circuit device.

14. The integrated circuit device of claim 13 wherein the components of the second type further comprise all memory devices in the integrated circuit device.

15. A method of configuring an integrated circuit device for testing, the integrated circuit device having externally-facing components of a first type which transfers signals outside itself, and having internally-facing components, of a second type which transfers signals purely within itself, that consume power when clocked even when not active, the method comprising:
configuring clock gating circuitry to, during testing of the externally-facing components of the first type, gate off clock signals to prevent the clock signals from reaching the internally-facing components of the second type.

16. The method according to claim 15 of configuring an integrated circuit device for testing wherein configuring the clock gating circuitry to prevent the clock signals from reaching the internally-facing components of the second type comprises providing a respective clock gating element configured to prevent the clock signals from reaching each respective internally-facing component of the second type, each respective clock gating element comprising at most four transistors.

17. The method according to claim 15 of configuring an integrated circuit device for testing wherein configuring the clock gating circuitry to prevent the clock signals from reaching the internally-facing components of the second type comprises configuring a single clock gating element, comprising at most four transistors, to prevent propagation of the clock signals out of a clock source of the internally-facing components of the second type.

18. The method according to claim 15 of configuring an integrated circuit device for testing wherein configuring the clock gating circuitry to prevent the clock signals from reaching the internally-facing components of the second type comprises:
providing a plurality of clock gating elements, each clock gating element comprising at most four transistors; and
configuring individual ones of clock gating elements among the plurality of clock gating elements to prevent propagation of the clock signals to a respective branch of a clock tree, each respective branch including only the internally-facing components of the second type.

19. The method according to claim 18 of configuring an integrated circuit device for testing, wherein configuring each clock gating element in the plurality of clock gating elements to prevent propagation of the clock signals to the respective branch of the clock tree comprises:
providing a first clock gating element at one of the internally-facing components of the second type;
moving the first clock gating element away from the one of the internally-facing components of the second type toward a source of the clock signals until a first node in the clock tree is reached;
examining at the first node in the clock tree whether the first node feeds any externally-facing components of the first type;
when the first node feeds any externally-facing components of the first type, returning the first clock gating element to the one of the internally-facing components of the second type; and
when the first node does not feed any externally-facing components of the first type, repeating the providing, the moving and the examining with additional nodes closer to the source of the clock signals until (a) reaching a further node that feeds at least one externally-facing component of the first type, or (b) reaching the source of the clock signals, and then moving the first clock gating element one node further from the source of the clock signals.

20. The method according to claim 19 of configuring an integrated circuit device for testing, further comprising, when any one of the first node or any further node is a selector configured to allow selection among a plurality of clock signals, positioning the first clock gating element at an output of the selector.

21. The method according to claim 19 of configuring an integrated circuit device for testing, further comprising:
before the moving, advancing the first clock gating element to the source of the clock signal;
examining whether the first clock gating element at the source of the clock signal feeds any externally-facing components of the first type;
when the first clock gating element at the source of the clock signal does not feed any externally-facing components of the first type, maintaining the first clock gating element at the source of the clock signal; and when the first clock gating element at the source of the clock signal feeds at least one externally-facing component of the first type, returning the first clock gating element to the one of the internally-facing components of the second type and executing the moving.

* * * * *